(12) United States Patent
Tellkamp

(10) Patent No.: US 7,821,111 B2
(45) Date of Patent: Oct. 26, 2010

(54) SEMICONDUCTOR DEVICE HAVING GROOVED LEADS TO CONFINE SOLDER WICKING

(75) Inventor: John Tellkamp, Rockwall, TX (US)

(73) Assignee: Texas Instruments Incorporated, Dallas, TX (US)

( * ) Notice: Subject to any disclaimer, the term of this patent is extended or adjusted under 35 U.S.C. 154(b) by 449 days.

(21) Appl. No.: 11/867,821

(22) Filed: Oct. 5, 2007

(65) Prior Publication Data

US 2009/0091007 A1 Apr. 9, 2009

(51) Int. Cl.
*H01L 23/495* (2006.01)
*H01L 23/28* (2006.01)

(52) U.S. Cl. ............... 257/666; 257/674; 257/E23.031

(58) Field of Classification Search ........... 257/666, 257/674, E23.031
See application file for complete search history.

(56) References Cited

U.S. PATENT DOCUMENTS

| | | | | |
|---|---|---|---|---|
| 4,920,074 | A * | 4/1990 | Shimizu et al. | 29/827 |
| 5,132,772 | A * | 7/1992 | Fetty | 257/779 |
| 5,367,124 | A | 11/1994 | Hoffman et al. | |
| 5,391,439 | A * | 2/1995 | Tomita et al. | 428/571 |
| 6,040,626 | A * | 3/2000 | Cheah et al. | 257/735 |
| 6,989,588 | B2 * | 1/2006 | Quinones et al. | 257/680 |
| 7,208,818 | B2 * | 4/2007 | Luo et al. | 257/666 |
| 7,238,551 | B2 * | 7/2007 | Kasem et al. | 438/123 |
| 2003/0006055 | A1 * | 1/2003 | Chien-Hung et al. | 174/52.1 |
| 2003/0052408 | A1 * | 3/2003 | Quinones et al. | 257/737 |
| 2007/0029650 | A1 * | 2/2007 | Lim et al. | 257/666 |

FOREIGN PATENT DOCUMENTS

| | | | |
|---|---|---|---|
| JP | 60143654 | A | 7/1985 |
| JP | 01315167 | A1 | 12/1989 |
| JP | 02076289 | A | 3/1990 |

* cited by examiner

*Primary Examiner*—Nitin Parekh
(74) *Attorney, Agent, or Firm*—Yingsheng Tung; Wade J. Brady, III; Frederick J. Telecky, Jr.

(57) ABSTRACT

A packaged surface-mount semiconductor device has the outer, un-encapsulated lead segments structured in five adjoining portions: The first portion protrudes from the encapsulation about horizontally; the second portion forms a convex bend downwardly; the third portion is approximately straight downwardly; the fourth portion forms a concave bend upwardly; and the fifth portion is straight horizontally. Each segment has across the width a first groove in the third portion, either on the bottom surface or on the top surface. Preferably, the groove is about 2 leadframe thicknesses vertically over the bottom surface of the fifth lead portion. When stamped, the groove may have an angular outline about 5 and 50 µm deep; when etched, the groove may have an approximately semicircular outline about 50 to 125 µm deep. A second groove may be located in the second segment portion; a third groove may be located in the transition region from the third to the fourth segment portions.

6 Claims, 3 Drawing Sheets

SEMICONDUCTOR DEVICE HAVING GROOVED LEADS TO CONFINE SOLDER WICKING

FIELD OF THE INVENTION

The present invention is related in general to the field of semiconductor devices and processes, and more specifically to surface-mount devices with leads, which have grooves to confine solder wicking.

DESCRIPTION OF THE RELATED ART

Leadframes for semiconductor devices provide a stable support pad for firmly positioning the semiconductor chip, usually an integrated circuit (IC) chip, within a package. It has been common practice to manufacture single piece leadframes from thin (about 100 to 250 µm) sheets of metal. For reasons of easy manufacturing, the commonly selected starting metals are copper, copper alloys, iron-nickel alloys (for instance the so-called "Alloy 42"), and aluminum. The desired shape of the leadframe is stamped or etched from the original sheet.

In addition to the chip pad, the leadframe offers a plurality of conductive segments to bring various electrical conductors into close proximity of the chip. The remaining gaps between the inner end of the segments and the contact pads on the IC surface are bridged by connectors, typically thin metal wires such as gold individually bonded to the IC contact pads and the leadframe segments.

The end of the lead segments remote from the IC chip ("outer" ends) need to be electrically and mechanically connected to external circuitry such as printed circuit boards. This attachment is customarily performed by soldering, conventionally with a lead/tin alloy solder at a reflow temperature above 200° C. Consequently, the surface of the outer segment ends needs to have a metallurgical configuration suitable for reflow attachment to external parts.

Assembly difficulties have recently appeared, when lead-free solders have to be used due to environmental concerns, because these solders frequently display solder wicking problems. When wicking appears, a large part of the solder, sometimes almost all of the solder, is pulled by surface tension away from the solder location into lead portions, which are not involved in device attachment. Board attachment of devices may thus become poorly controlled and unreliable.

Other recent technical trends have aggravated the device attachment process. As an example, the package dimensions and also the lead lengths are shrinking, offering less surface for solder attachment. Then, the requirement to use lead-free solders pushes the reflow temperature range into the neighborhood of about 260° C., making it more difficult to contain solder wicking.

In addition, market pressures push for cost reduction of leadframes and thus emphasize the reduction of any costly metal used for the leadframe. This is especially true for the amount of any noble metal, which might be customarily used in leadframes, such as gold or palladium, is to be minimized. This cost reduction may have another deleterious impact on the wicking problem.

SUMMARY OF THE INVENTION

Applicant recognizes the need for a low-cost, yet reliable approach to fabricate surface-mount devices with leadframe structures avoiding the risk of solder wicking for any solder and any leadframe material. In addition, the approach needs to be applicable to those devices, which are already at the final assembly stage of trimming and forming, as well as to new devices, which still have the option of employing leadframes with built-in precautions to eliminate the danger of wicking in the first place. There are technical advantages, when the leadframe and its method of fabrication are flexible enough to be applied for different semiconductor product families and a wide spectrum of design and assembly variations, and achieve improvements toward the goals of improved process yields and device reliability.

Applicant conducted a mechanical and metallurgical investigation of the soldering process of leads of surface-mount devices at elevated temperatures. When liquid solder is wicking, it is drawn by the capillary force, based on surface tension, along the solid surface underneath. Applicant realized that the work of lifting solder continues until the surface energy gained is balanced by the energy needed to lift the mass of solder against gravity. When this equilibrium is reached, there is no extra energy for pulling up solder and the wicking stops. Applicant discovered that solder wicking can be slowed and stopped, when, on the climb up the leads, the mass of the liquid solder is locally accumulated by collecting solder in cave-like traps until the solder action comes to a halt altogether by lowering the temperature and solidifying the solder.

One embodiment of the invention is a packaged surface-mount semiconductor device with a leadframe, which has the outer segments of the leads un-encapsulated by the package. The outer segments have a width and a length; it is convenient to consider the length structured in five adjoining portions. The first portion protrudes from the encapsulation about horizontally. The second portion forms a convex bend downwardly. The third portion is approximately straight downwardly. The fourth portion forms a concave bend upwardly. The fifth portion is straight horizontally.

In the embodiment of the invention, there is a first groove across the width in the third portion of each segment; this groove may be located on the bottom segment surface, or it may be located on the top segment surface. In either case, the groove is preferably about 2 leadframe thicknesses vertically over the bottom surface of the fifth lead portion.

The groove may have an angular outline with a depth between about 5 and 50 µm, preferably made by stamping, or it may have an approximately semicircular outline with a depth between about 50 to 125 µm, preferably made by etching. In addition to the first groove, a second groove may be located in the second segment portion; for some devices, a third groove may be located in the transition region from the third to the fourth segment portions.

Other embodiments of the invention are methods for fabricating a semiconductor device, which are differentiated by the techniques employed to create the grooves in the leads. The grooves may either be stamped or they may be etched. For creating the grooves by stamping, the method starts by providing a metallic leadframe with a top and a bottom surface, a thickness, and inner and outer segments. The outer segments are configured as leads with a width and a length; they are interconnected by dambars. Then, a semiconductor chip is assembled on the inner segments, and the chip and the inner segments are enclosed in plastic encapsulation, leaving the leads unenclosed.

Next, the dambars are removed and the first grooves are stamped across the width of each lead, either into the bottom or the top surface of the leads. The stamping is performed either concurrently with or sequential to the removal of the dambars. The outline of the grooves is approximately angular with a depth between about 5 and 50 µm. Then, the length of the leads is formed into five adjoining portions: A first portion protruding from the encapsulation about horizontally; a second portion forming a convex bend downwardly; a third portion being approximately straight downwardly, wherein the third portion includes the groove; a fourth portion forming a concave bend upwardly; and a fifth portion being straight horizontally. The groove is positioned about 2 leadframe thicknesses vertically over the bottom surface of the fifth portion.

For creating the grooves by etching, the method starts by providing a metallic leadframe with a top and a bottom surface and a thickness. Inner and outer segments are then formed, wherein the outer segments are configured as leads with a width and a length, and are interconnected by dambars. Next, a first groove is etched across the width of each lead, preferably with semicircular contour and between 50 and 225μ deep. The groove may be etched into the bottom surface or the top surface of the leadframe.

A semiconductor chip is assembled on the inner segments, and the chip and the inner segments are enclosed in plastic encapsulation, leaving the leads unenclosed. The dambars are removed and the length of the leads is formed into five adjoining portions: A first portion protruding from the encapsulation about horizontally; a second portion forming a convex bend downwardly; a third portion being approximately straight downwardly, wherein the third portion includes the groove; a fourth portion forming a concave bend upwardly; and a fifth portion being straight horizontally. The groove is positioned about 2 leadframe thicknesses vertically over the bottom surface of the fifth portion.

The technical advances represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
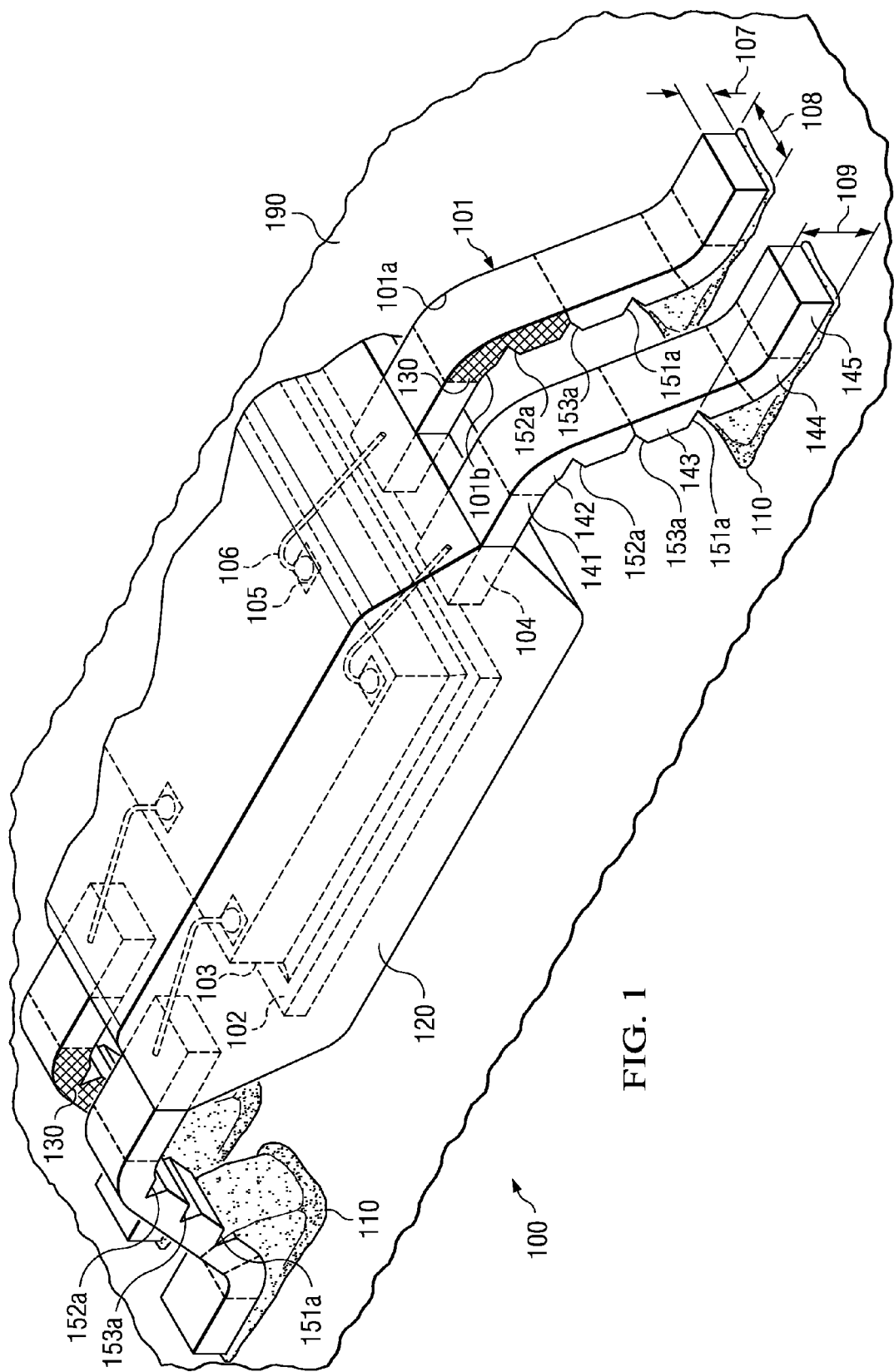
FIG. 1 is a schematic perspective view of a portion of a surface-mount device having lead segments featuring grooves on the bottom surface according to the invention.

FIG. 1 illustrates an embodiment of the invention. It depicts a portion of a semiconductor device, generally designated 100, which belongs to the family of surface mount products. These devices have insulating packages 120 with protruding metal segments 101, which are outside package 120 and thus referred to as outer segments 101. The outer segments are shaped and formed to be attached to the surface of a substrate or board 190 using solder 110; the shape illustrated in FIG. 1 is commonly referred to as "gull-wing" shape. After a surface-mount device is solder-attached to the substrate, it is easy to visually inspect all solder reflow sites in order to confirm defect-free attachment and contacts—one main reason why surface mount devices are so popular in the semiconductor industry.

The metallic parts of device 100 include pad 102 for firmly positioning the semiconductor chip 103; metallic outer segments 101; and metallic segments 104 inside the package 120 ("inner" segments). Inner segments 104 and outer segments 101 are portions of the leads of device 100 and serve to bring electrical power, ground, and signals into close proximity of the chips. The remaining gap between the tip of the inner segments 104 and the contact pads 105 on the chip surface are typically bridged by thin wires 106, individually bonded to the chip contact pads and the leadframe inner segments. Consequently, chip 103 is electrically connected by bonding wires 106 to the inner segments 104. At the beginning of the device assembly process, pad 102 and segments 101 and 104 were held together by a metal frame (not indicated in FIG. 1) and are thus commonly referred to as parts of the original device "leadframe". Furthermore at the beginning of the assembly process, the segments were mechanically stabilized by metal rails, which were positioned so that they could also function as dams against any plastic material being accidentally squeezed out by the high pressure employed in the molding process; consequently, these rails are referred to as "dam-bars".

For reasons of easy and cost-effective manufacturing, it has been common practice to manufacture single piece leadframes from thin, flat sheets of metal such as copper, copper alloy, aluminum, and iron/nickel alloy. The typical range for the thickness 107 of the sheet and thus of the segments 101 and 104 is between about 100 to 250 μm. The leadframe sheet and thus the leads including outer segments 101 have a top surface 101a and a bottom surface 101b. The desired shape of the total leadframe is etched or stamped from this original sheet. In this manner, an individual lead including the outer segment of the leadframe takes the form of a thin, flat, elongated metallic strip with its particular length and width determined by the design. In the embodiment of FIG. 1, the widths of the outer segments of device 100 are equal and are designated 108. The dimension of width 108 may vary greatly, dependent on the segment pitch center-to-center. Among various device types, the pitch may vary from about 1.27 to 0.15 mm.

After the assembly of the chip on the leadframe, the assembled parts are encapsulated ("packaged"), preferably by a plastic molding technique. As a result, shown in FIG. 1, chip 103 and inner segments 104 are enclosed in package 120, while the outer segments 101 remain un-enclosed. In the next process step, the metallic frame (not shown in FIG. 1), which held the leadframe parts together, is mechanically removed ("trimmed"). Concurrently, the dam-bars (not shown in FIG. 1) between the segments are mechanically excised. In FIG. 1, the locations, where dam-bars originally interconnected two adjacent segments, are marked by crosshatching 130.

After the trimming process, but preferably in the same machine, a "forming" process is executed, in which the length of the outer segments of the device is pressed into a specific shape so that the outer segments can serve as electrical leads of the device and interconnect the device to externals parts. FIG. 1 illustrates the result of the forming process according to the invention, which structures the length of the outer segments in five adjoining portions.

The first portion, designated 141, protrudes from the encapsulation 120 about horizontally and extends to the location, where the dam-bar was located. The length of portion 141 may vary from about 50 to 370 μm. In the second portion 142, the segment forms a convex bend downwardly; the second portion preferably has a length between about 250 and 1250 µm.

The third portion 143 is approximately straight and oriented downwardly. The length of portion can vary greatly, since it principally determines the distance of package 120 from the attachment substrate. For many devices, the length of portion 143 is between about 250 and 1250 µm or more. The fourth portion 144 forms a concave bend upwardly. It may be somewhat tighter bent than portion 142; its preferred length is between about 250 and 1000 µm. The fifth portion 145 is straight horizontally; its length may vary greatly, but is preferably in the range from about 500 to 1500 µm.

It is primarily the portions 145 and 144 of segment 101, which are involved in the solder attachment of device 100 to substrate 190. In order to facilitate the flow of solder 110, it is preferred to provide at least the surface 101b of portions 145 and 144 with a metal layer, which has affinity to tin-based solder. Preferred metal layers include nickel followed by an outer palladium layer, or a nickel followed by an outer gold layer.

On the other hand, when segment portions 143 and especially portions 142 and 141 are being covered by solder, the detrimental effect of solder wicking is observed. Solder is being pulled away from portions 145 and 144 so that it is missing where it is needed for attachment; it accumulates along the portions nearer package 120, where it is useless.

Shortly after the onset of the soldering process, the flux used together with the liquid solder enables the formation of a thin film along the surface of a lead segment, wetting the segment surface. In the wicking process, energy is needed to pull a volume of solder (usually based on tin with a density of 7.3 g·cm$^{-3}$) against gravity upwards, while surface energy is freed up by consuming a portion of the surface-wetting flux film. In the beginning of the process, the freed energy is dominating; with advancing solder pull-up, however, the energy needed to lift the accumulating solder mass approaches the freed-up energy, finally reaching equal magnitude. The segment grooves of the invention serve as locations for accumulating the solder mass required to top the wicking process. In many assembly applications, the time span, in which the solder remains liquid, is short so that the slow-down caused by the grooves to the wicking process is already enough to contain any deleterious wicking effect, before the temperature drops again and the solder solidifies.

To prevent solder wicking, FIG. 1 shows each lead 101 having at least one groove across the segment width 108. Similarly, in the embodiment of FIG. 2, each lead 101 has at least one groove across segment width 108. In FIG. 1, first groove 151a is located in the third segment portion 143; the location can be more specifically characterized by the groove centerline. Groove 151a has a depth and a contour; in FIG. 1, the depth of groove 151a is extending from bottom surface 101b into the segment metal. In analogy, in FIG. 2, first groove 151b is located in the third segment portion 143; the location can be more specifically characterized by the groove centerline. Groove 151b has a depth and a contour, wherein the depth is extending from top surface 101a into the segment metal.

The centerline of grooves 151a and 151b runs across width 108, normal to the segment edges. It is preferred that the groove centerline is about 2 leadframe thicknesses 107 vertically over the bottom surface 101b of the fifth segment portion 145. This location has a distance 109 in FIGS. 1 and 2.

Figure 3:
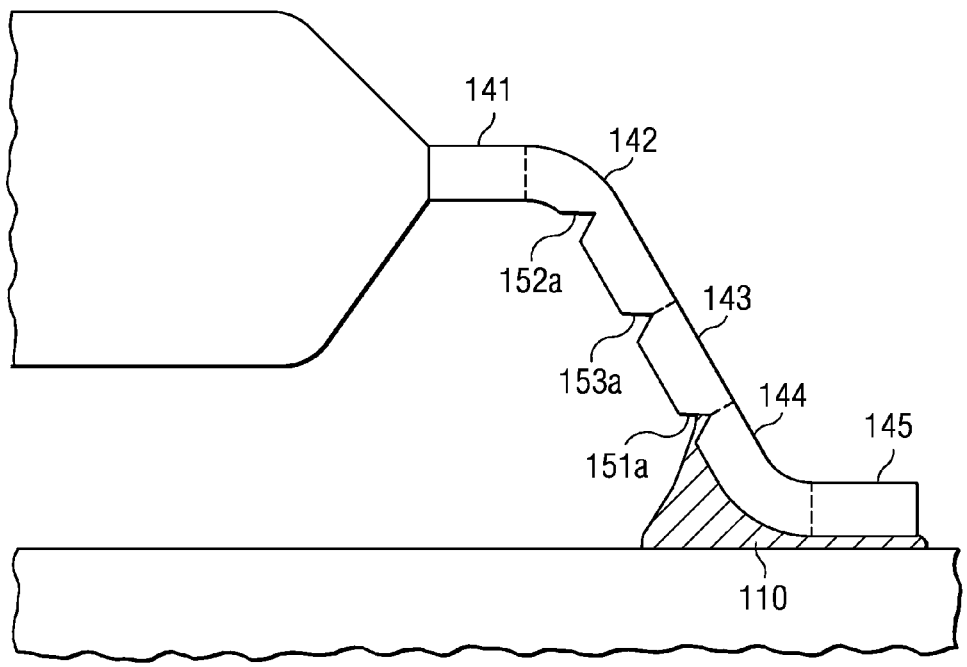
FIG. 3 is a schematic cross section of a portion of a surface mount device having lead segments featuring angular-outlined grooves on the bottom surface.

The depth of the grooves depends on the methods used for creating the grooves (see below); each method produces a characteristic outline of the grooves. When the grooves are created by stamping, as is preferably done in the package trim-and-from operations, they have an approximately angular outline. More detail of this outline is depicted in FIG. 3. In the case of an angular outline, the preferred depth is between about 5 and 50 µm, preferably less than one half segment thickness 107.

Figure 4:
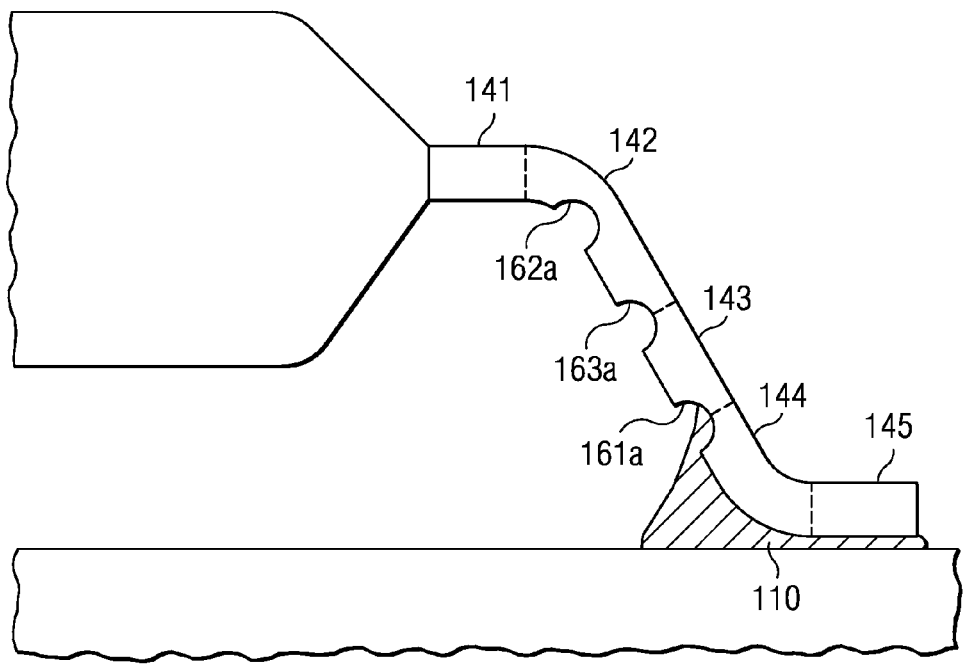
FIG. 4 is a schematic cross section of a portion of a surface mount device having lead segments featuring semicircular-outlined grooves on the bottom surface.

On the other hand, when the grooves are created by a etching, as is often done within the processes of manufacturing the leadframe, they have an approximately semicircular outline. More detail of this outline is depicted in FIG. 4. In this case, the preferred groove depth is between about 50 and 125 µm, approximately one half segment thickness 107.

Figure 2:
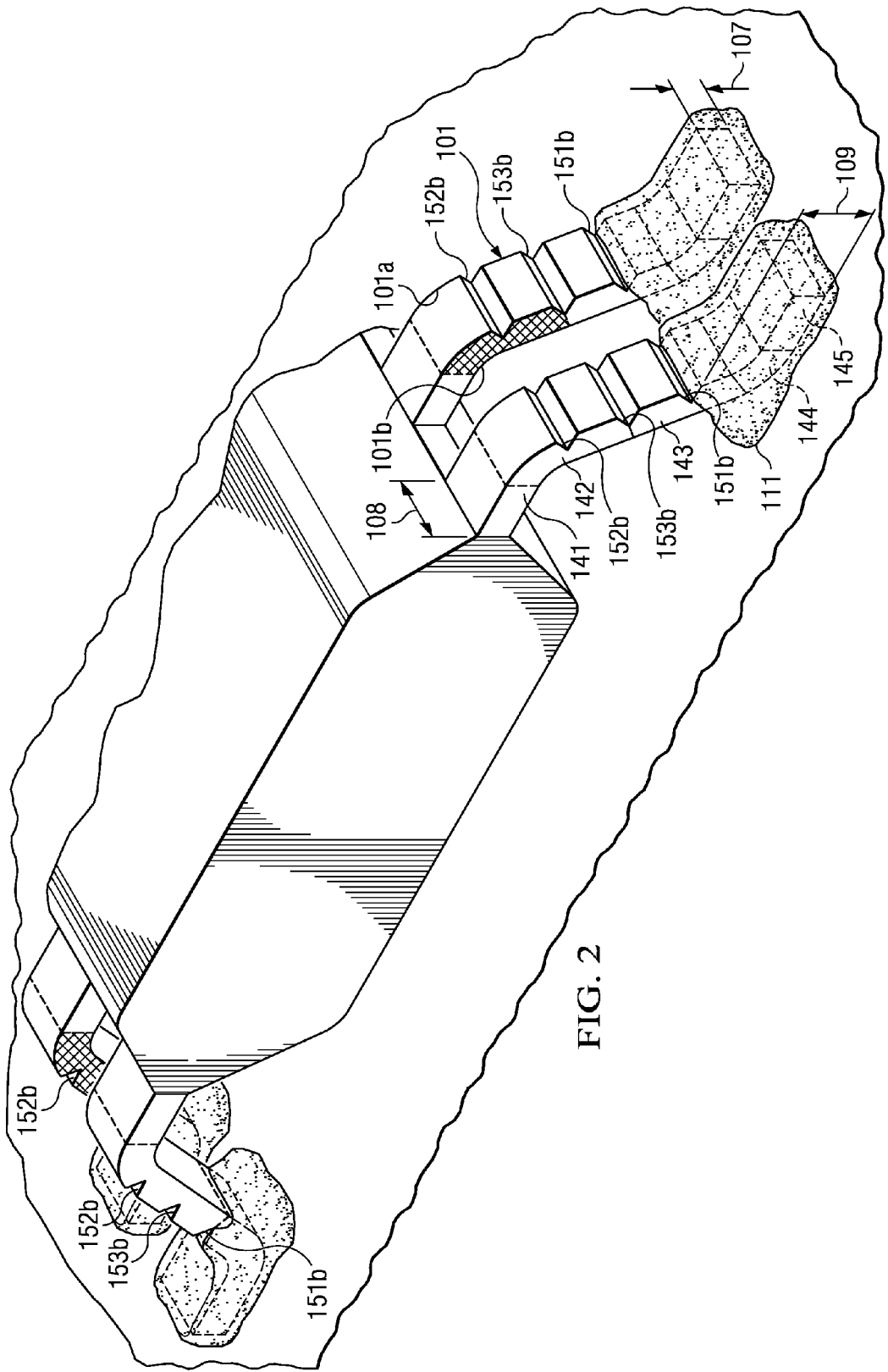
FIG. 2 is a schematic perspective view of a portion of a surface-mount device having lead segments featuring grooves on the top surface according to the invention.

It should be pointed out that in FIG. 2, solder 111 is not only wetting the bottom surface 101b of segment portions 144 and 145, but also the top surface 101a. Solder 111 can, therefore, be stopped effectively by the grooves reaching form top surface 101a into the segment metal.

As FIGS. 1 and 2 show, it is preferred in many device applications to have more than one groove in each segment in order to securely prevent solder wicking; these additional grooves can be manufactured without extra cost. The locations of the additional grooves can be deliberately chosen; as an example, in FIG. 1, a second groove 152a is located in the second segment portion 142, approximately in the middle of the convex curvature of portion 142; like groove 151a, groove 152a is made on the bottom surface 101b of the outer segment. In contrast, in FIG. 2 the second groove 152b is made on the top surface 101a of the outer segment. While the location of the second groove may be chosen deliberately, FIG. 2 depicts groove 152b located in the second portion 142, approximately in the middle of the convex curvature of portion 142.

As another example for an additional groove, a third groove 153a in FIG. 1 is located at the transition from the second to the third portion of the outer segment; it should be pointed out, though, that the location of the third groove is flexible. Like groove 151a, groove 153a is made on the bottom surface 101b of the outer segment. In contrast, in FIG. 2 the third groove 153b is made on the top surface 101a of the outer segment. While the location of the third groove may be flexible, FIG. 2 depicts groove 153b at the transition from the second to the third portion of the outer segment.

It is within the scope of the invention that a plurality of additional grooves may be applied to the outer segments, extending either from the bottom segment surface into the metal, or from the top surface. Further, the contours of the additional grooves may be angular or semicircular.

The schematic cross section of FIG. 3 repeats the groove locations and angular outlines of FIG. 1 and allows a comparison to the semicircular groove outlines in FIG. 4. It is preferred to create the groove shapes of FIG. 3 by stamping relatively shallow contours at the trim-form packaging step in the device fabrication. The grooves can thus be applied to already existing, almost finished products. In contrast, the groove shapes of FIG. 4 are preferably produced by etching relatively deep contours as an early step in leadframe fabrication.

For ease of comparison, the angular grooves in FIG. 3 are in the same locations as the angular grooves in FIG. 1; the grooves in FIG. 3 also have been given the corresponding designations to the grooves in FIG. 1.

In contrast, the semicircular grooves in FIG. 4 are in corresponding locations to the angular grooves in FIGS. 1 and 3, but have been given different designations (161a, 162a, 163a), since they not only have different outlines, but are also fabricated at different process steps in the manufacturing method (see below).

In more detail, the method for fabricating semiconductor devices with the angular grooves, shown in FIGS. 1, 2 and 3, originating at the bottom (or at the top) segment surface, starts by providing a metallic leadframe strip with a top and a bottom surface, a thickness, and a plurality of assembly sites with inner and outer segments. The outer segments have a width and a length, and they are interconnected by dambars. Semiconductor chips are then provided.

A semiconductor chip is assembled (for example, using an adhesive) on each assembly site and connected (for instance by wire bonding) to the inner segments. The assembled chips and the inner segments are then enclosed in plastic encapsulation, leaving the outer segments unenclosed. The sites are then singulated (for instance by sawing) from the strip.

Next, the dambars are removed (by punching) in the leadframe trimming machine. In addition, in this machine a first groove is stamped across the width of each lead. The stamping tool can make its indents into the bottom surface of the segments, or into the top surface. The stamping of the groove may be performed concurrently with the dambar removal, or sequential to the step of removing the dambar. The groove has an outline (preferably angular for the stamping technique) and a depth. For stamping, the depth is preferably between about 5 and 50 μm. Further, the groove has a centerline; as specified below, the centerline has a preferred location relative to the bottom surface of the segment.

In the next process steps, the forming of the un-encapsulated segments is executed in a forming machine. The length of the outer segments is formed into five adjoining portions: A first portion, which protrudes about horizontally from the encapsulation; a second portion, which is bent downwardly in a convex curvature; a third portion, which is oriented approximately straight downwardly and which includes the groove (either stamped into the bottom segment surface or into the top segment surface); a fourth portion, which forms a concave bend upwardly and transitions into a fifth portion being straight horizontally. It is preferred that the groove centerline lies about 2 leadframe thicknesses vertically over the bottom surface of the fifth portion.

In addition to the first groove, the same process flow allows the fabrication of a second, a third, or more grooves. The step of stamping may, for example, include the stamping of a second groove on the bottom surface (or on the top surface) and across the segment width, wherein the second groove is preferably located in the second portion of the outer segment. In addition, the step of stamping may further include the stamping of a third groove on the bottom surface (or on the top surface) and across the segment width, wherein the third groove is preferably located at the transition from the second to the third portion of the outer segment.

Another embodiment of the invention is a method for fabricating a semiconductor device with the semicircular grooves, shown in FIG. 4, originating at the bottom or the top segment surface, starts by providing a metallic sheet having a top and a bottom surface, and a thickness. A leadframe strip is formed including a plurality of assembly sites with leads having inner and outer segments. The outer segments have a width and a length and are interconnected by dambars. Next, a first groove is etched across the width of each outer segment, preferably with the aid of a mask. The etching may be performed into the bottom surface of the metallic sheet, or into the top surface. For most leadframe metals, the grooves have an approximately semicircular outline and preferably a depth between about 50 and 125 μm. The grooves further have a centerline; as specified below, the centerline has a preferred location relative to the bottom surface of the segments.

Semiconductor chips are then provided. A chip is assembled (for example, by using an adhesive) on each assembly site and connected (for instance by sire bonding) to the inner segments. The assembled chips and the inner segments are then enclosed in plastic encapsulation, leaving the outer segments unenclosed. The sites are then singulated from the strip. Next, the dambars are removed, for instance by punching in a trimming machine.

In the next process step, the forming of the un-encapsulated segments is executed in a forming machine. The length of the outer segments is formed into five adjoining portions: A first portion, which protrudes about horizontally from the encapsulation; a second portion, which is bent downwardly in a convex curvature; a third portion, which is oriented approximately straight downwardly and which includes the groove (either etched into the bottom segment surface or into the top segment surface); a fourth portion, which forms a concave bend upwardly and transitions into a fifth portion being straight horizontally. It is preferred that the groove centerline lies about 2 leadframe thicknesses vertically over the bottom surface of the fifth portion.

In addition to the first groove, the same process flow allows the fabrication of a second, a third, or more grooves. The step of etching may, for example, include the etching of a second groove on the bottom surface (or on the top surface) and across the segment width, wherein the second groove is preferably located in the second portion of the outer segment. In addition, the step of etching may further include the etching of a third groove on the bottom surface (or on the top surface) and across the segment width, wherein the third groove is preferably located at the transition from the second to the third portion of the outer segment.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to products using any type of semiconductor chip, discrete or integrated circuit, and the material of the semiconductor chip may comprise silicon, silicon germanium, gallium arsenide, or any other semiconductor or compound material used in integrated circuit manufacturing.

As another example, instead of a single chip assembled inside the encapsulation, the device may employ a stack of chips, and the assembly may employ the flip-chip technology. As another example, the chip assembly site may be metal of another material.

It is therefore intended that the appended claims encompass any such modifications or embodiment.

I claim:

1. A semiconductor device comprising:
    a metallic leadframe having a top and a bottom surface, a first thickness, and inner and outer segments;
    a semiconductor chip connected to the inner segments;
    the chip and the inner segments enclosed in plastic encapsulation, the outer segments un-enclosed;
    the outer segments having the first thickness a width and a length structured in five adjoining portions:
        the first portion protruding from the encapsulation about horizontally; the second portion forming a convex bend downwardly;
        the third portion being approximately straight downwardly;
        the fourth portion forming a concave bend upwardly; and the fifth portion being straight horizontally; the first, the second, the fourth and the fifth portions having the first thickness widthwise and lengthwise each lead having across the width a first groove located in the third portion, the groove having a centerline, and a depth; and a solder material bonding the fifth portion of the lead to a substrate and filling the groove.

2. The device according to claim 1 wherein the groove is on the bottom surface of the leadframe.

3. The device according to claim 1 wherein the groove is on the top surface of the leadframe.

4. The device according to claim 1 wherein the groove centerline is about 2 leadframe thicknesses vertically over the bottom surface of the fifth portion.

5. The device according to claim 1 wherein the groove has an approximately angular outline and a depth between about 5 and 50 μm.

6. The device according to claim 1 wherein the groove has an approximately semicircular outline and a depth between about 50 and 125 μm.

* * * * *